Aug. 22, 1967 M. H. POSTON 3,337,751
INTEGRATED CIRCUITRY INCLUDING SCR AND
FIELD-EFFECT STRUCTURE
Filed Jan. 29, 1965 2 Sheets-Sheet 1

INVENTOR.
MELVIN H. POSTON
BY [signatures]
ATTYS.

Aug. 22, 1967 M. H. POSTON 3,337,751
INTEGRATED CIRCUITRY INCLUDING SCR AND FIELD-EFFECT STRUCTURE
Filed Jan. 29, 1965 2 Sheets-Sheet 2

INVENTOR.
MELVIN H. POSTON
BY
ATTYS.

United States Patent Office 3,337,751
Patented Aug. 22, 1967

3,337,751

INTEGRATED CIRCUITRY INCLUDING SCR AND FIELD-EFFECT STRUCTURE

Melvin H. Poston, Annapolis, Md., assignor, by mesne assignments, to the United States of America as represented by the Secretary of the Navy Filed Jan. 29, 1965, Ser. No. 429,180
14 Claims. (Cl. 307—88.5)

The present invention relates to a multiple semiconductor assembly and more particularly to a single semiconductor wafer carrying a plurality of field effect resistances and a silicon control rectifier.

The desirability of constructing electronic high voltage switching circuits in a single compact package has been established. Very briefly, circuits which are made in the form of a single compact package take up less space, weigh less, and are more rugged than circuits composed of multiple integral elements. Additionally, they may have smaller power requirements, generate less waste heat and are easier to replace than components of conventional circuits.

An object of the invention is to provide a high voltage multiple position semiconductor switch having a constant output impedance.

Another object of the invention is to provide a solid state high voltage semiconductor switch having sharp rise and fall times.

A further object of the invention is to provide a high voltage semiconductor switch which is extremely rugged and occupies a small volume.

Other objects and many of the attendant advantages of this invention will be readily appreciated as the same becomes better understood by reference to the following detailed description when considered in connection with the accompanying drawings wherein.

Figure 1:
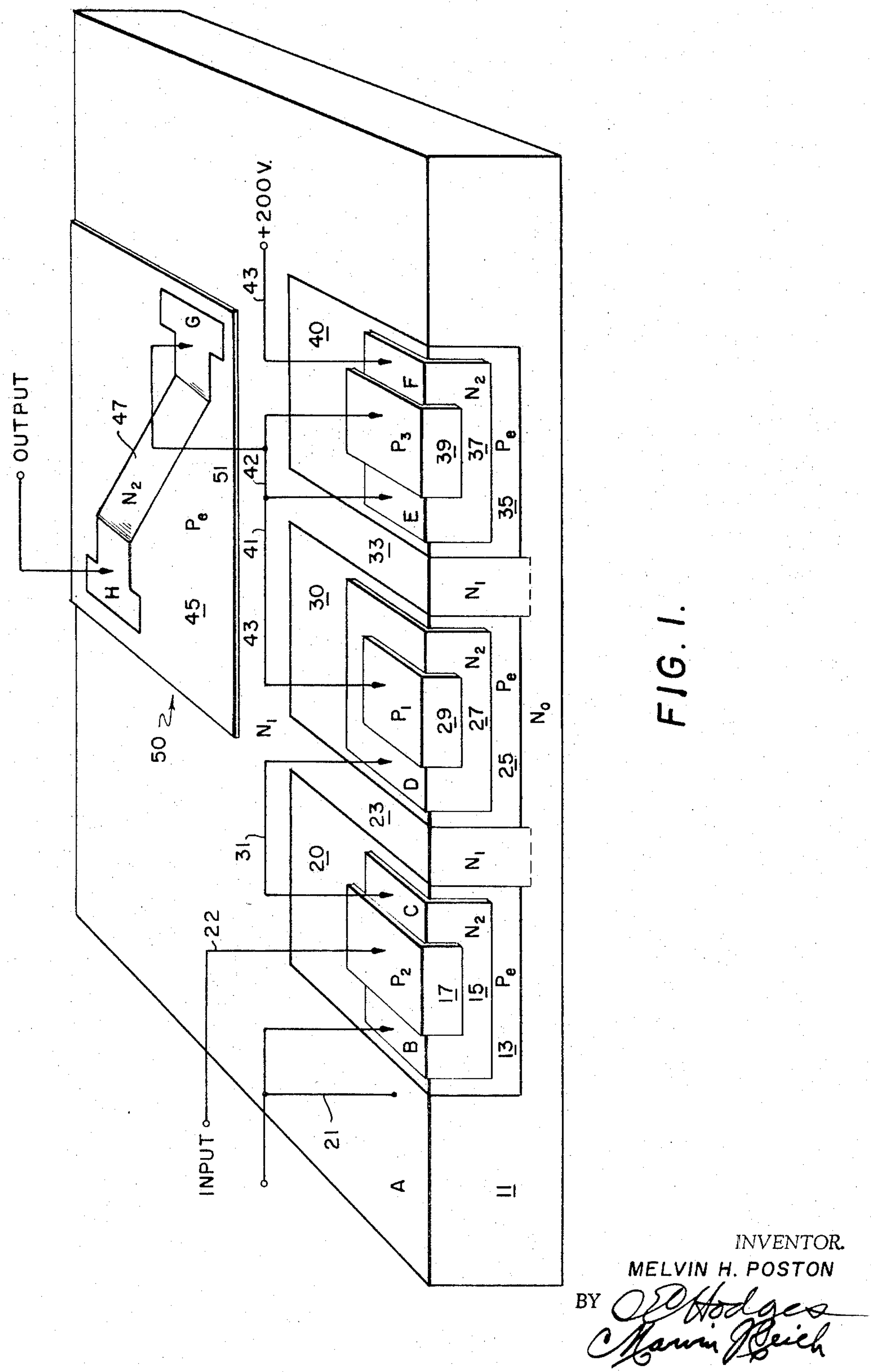
FIG. 1 is a perspective view of a semiconductor wafer embodying the invention.

Referring to FIG. 1 a semiconductor wafer 11 is made out of any suitable N-type semiconductor material such as silicon, germanium, or the like. However, P-type semiconductor material may be used as a starter material in place of the N-type semiconductor material, noting that P-type layer is substituted for N-type layers and that N-type layers are substituted for P-type layers in the device described hereafter. A first P-type epitaxial layer 13 is diffused into the semiconductor wafer 11. An N-type layer 15 is diffused into the P-type epitaxial layer 13 and a P-type layer 17 is diffused on the N-type layer 15. Layers 13, 15 and 17 form a pinch off field effect transistor 20. A conductive lead 21 is provided for connecting zone A of the semiconductor wafer 11 with zone B of the semiconductor wafer. Zone B of the semiconductor wafer is one side of the N-type layer 15 of the pinch off field effect transistor 20. Zone A of the semiconductor wafer 11 is the ground connection of the semiconductor wafer. The other input to the semiconductor wafer is connected through lead 22 to the P-type layer 17 of the pinch off field effect transistor 20.

A second P-type epitaxial layer 25 forms the floating zone of the silicon control rectifier 30. The P-type epitaxial layers 25 and 13 are isolated from one another by a zone of N-type material 23 which is provided in the crystal to a point below the P-type epitaxial layers. A second layer 27 of N-type material is diffused into the P-type epitaxial layer 25. The N-type layer 27 forms the control electrode of the silicon control rectifier 30. A P-type layer 29 is then diffused into the N-type layer 27 forming the collector electrode of the silicon control rectifier 30. Lead 31 connects terminal C of the pinch off field effect transistor 20 to terminal D of the silicon control rectifier 30.

A P-type epitaxial layer 35 is deposited on the semiconductor wafer 11. An N-type zone 33 separates the P-type epitaxial layer 25 from the P-type epitaxial layer 35. The N-type zone extends beyond the P-type epitaxial layer in order to afford isolation between P-type layers 25 and 35. An N-type layer 37 is diffused into the P-type epitaxial layer 35. A P-type layer 39 is diffused into the top of the N-type layer 37. Layers 35, 37 and 39 form a second field effect transistor 40. A lead 41 interconnects layer 29 of the silicon control rectifier 30 to the T terminal of the field effect transistor 40.

A fourth P-type epitaxial layer is diffused into the semiconductor wafer 11. This P-type layer is isolated from the other P-type layers by an N zone 43. An N-type layer 47 is deposited on the P-type epitaxial layer 45. This last N-type layer forms the output resistance 47. One end of the layer 47 is provided with a first terminal G, the other end of the layer 47 is provided with a terminal H. A lead 51 is connected to the lead 42 which interconnects the zone E and layer 39 of the fieldister 40. The other end of the lead 51 is connected to the terminal G. An output lead is connected to the terminal H on the layer 47.

Figure 2:
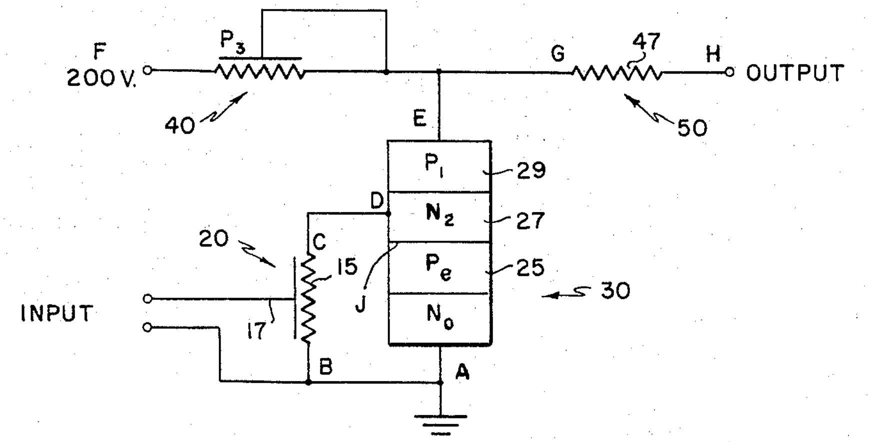
FIG. 2 is a circuit diagram of the semiconductor wafer illustrated in FIG. 1 embodying the invention.
Figure 3:
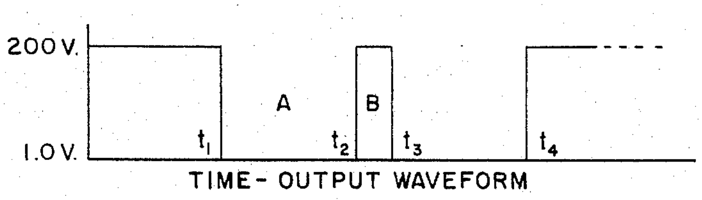
FIG. 3 is a graph of voltage versus time of the output pulse of the semiconductor wafer of FIG. 1 and the circuit of FIG. 2.
Figure 4:
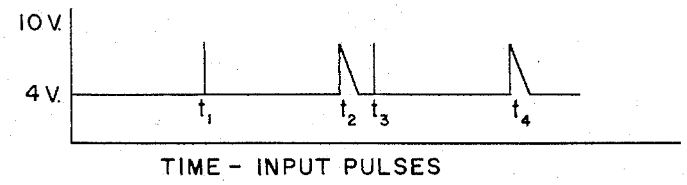
FIG. 4 is a graph of the voltage versus time of the input pulses of the semiconductor wafer of FIG. 1 and the circuit of FIG. 2.

FIG. 2 is the circuit diagram of the wafer of FIG. 1 and therefore the common element's present in FIG. 2 have the same numerical references as those appearing in FIG. 1.

Since it is easier to follow the operation of a circuit by looking at a circuit diagram the operation of FIG. 2 will be discussed, noting that FIG. 1 operates in identically the same manner as circuit in FIG. 2. At time $t_0$ there is an output of 200 volts at terminal H. At this time the silicon control rectifier 30 is non-conducting and therefore substantially all of 200 volts appearing at the input terminal F appears at the output terminal H.

When the silicon control rectifier 30 is in its non-conductive state, high impedance condition, substantially the entire voltage drop across the silicon control rectifier occurs at the junction J between the P-type zone 25 and the N-type zone 27. This voltage drop is approximately 200 volts. Continuing at time $t_0$ the field effect transistor 20 is in its high impedance condition with a four volt potential placed across its input terminals.

At time $t_1$ a 10 microsecond 6 volt pulse is superimposed on top of the 4 volts on the input electrode of the field effect transistor 20 raising the input voltage to 10 volts. This pulse reduces the impedance of the field effect transistor 20 causing current to flow from the 200 volt power supply at F through the field effect transistor 40 through the P-type zone 29 and the N-type zone 27 through the field effect transistor 20 to ground. This flow of current causes the silicon control rectifier to switch on by a phenomena called the current multiplication affect. At this time the voltage drop across the junction changes from 200 volts to approximately 1 volt. The silicon control rectifier is therefore switched into its high conduction-low impedance condition thereby placing a 1 volt output at terminal H of the circuit. When the silicon control rectifier 30 is in its high impedance state low conduction condition—at a time $t_0$, then the leakage current through the silicon control rectifier 30 is less than the pinch off current level of the semiconductor field effect transistor 40 leaving the semiconductor field effect transistor 40 in its low resistance state. However when the silicon control rectifier 30 is in its high conductive state—low resistance condition—then the collector electrode of the silicon control rectifier 30 is at substantially 1 volt causing the semiconductor field effect transistor 40 to become pinched off into its high resistance region. After the pulse applied at time $t_1$ has passed the field effect transistor 20 returns to its high impedance condition. The field effect transistor 40 is in its high resistance condition and the silicon control rectifier 30 is in its low impedance high conduction condition. The current conducted through the silicon control rectifier is equal to $I_{p.o.}$, the current conducted through the pinched off field effect transistor 40.

During the time the silicon control rectifier is conducting it has an output voltage of 1 volt at terminal H. The entire 1 volt appears across the junction J.

At time $t_2$ a 10 millisecond pulse is supplied to the control zone 17 of the field effect transistor 20 from the input. This 10 millisecond pulse has a 10 volt amplitude which is made up of the 4 volts residual voltage and 6 volt pulse. At this point it is important to note that the impedance of the silicon control rectifier which is mainly at the point of the junction J is 1 volt over $I_{p.o.}$. The 10 millisecond input pulse drives the field effect transistor 20 into its low impedance condition. Then in this last mention low impedance condition, the impedance of the field effect transistor 20 is much less than the impedance of a silicon control rectifier. Therefore, the current flowing through the silicon control rectifier is shunted through the field effect transistor 20. Thereby taking away the sustaining current of the silicon control rectifier 30 causing the silicon control rectifier 30 to cut off. When the silicon control rectifier 30 cuts off the voltage across the junction J jumps rapidly to the 200 volt level, and the output H jumps rapidly to the 200 volt level and the field effect transistor 40 switches into its low impedance condition. After the 10 millisecond pulse at time $t_2$ is completed the field effect transistor 20 returns to its high impedance condition. The circuit operates similarly for succeeding pulses at times $t_3$, $t_4$ etc. with the 10 microsecond pulse causing the silicon control rectifier to conduct and the 10 millisecond pulse causes the silicon control rectifier to shut off. It is to be noted that the pulses are alternately of 10 microsecond duration and 10 millisecond duration.

Obviously many modifications and variations of the present invention are possible in the light of the above teachings. It is therefore to be understood that within the scope of the appended claims the invention may be practiced otherwise than as specifically described.

What is claimed is:

1. An on-off control circuit for an electronic valve comprising:

an electronic valve means having a silicon control rectifier response curve having an input control electrode and an output terminal; and means having a single inpu and a single output and being responsive to successive pulses of the same polarity to turn said valve means to the on and off condition connected to said valve for controlling the on-off condition of said electronic valve means, said last name means having its output connected to said input control electrode of said electronic valve means, said means having a single input terminal for receiving control pulses whereby the output of said valve means is changed from an on or off condition.

2. A circuit for turning an electronic valve on and off as defined in claim 1 but further characterized by said first pulse for turning said electronic valve on having a first time duration and said second pulse for turning said electronic valve off having a time duration in the order of one thousand times as long as the time duration of said first pulse.

3. A circuit for tuning an electronic valve on and off as defined in claim 2 but further characterized by having said electronic valve comprising a silicon control rectifier.

4. A circuit for turning an electronic valve on and off as defined in claim 1 but further characterized by having said electronic valve comprising a silicon control rectifier.

5. A circuit for turning an electronic valve on and off comprising:

an electronic valve having an input and an output;

a source of voltage means having two impedance states connected in series with the output of said electronic valve and said source of voltage; and control means responsive to a first pulse of a given polarity for turning said electronic valve on and responsive to a second pulse of the same polarity as the first pulse for turning said electronic valve off, having a single input for receiving said first and second pulses and having a single output, said control means output being connected to said input of said electronic valve whereby said control means turns said electronic valve on and off in response to pulses of the same polarity.

6. A circuit for turning an electronic valve on and off as defined in claim 5 but further characterized by said first pulse for turning said electron valve on having a first time duration and said second pulse for turning said electron valve off having a time duration in the order of one thousand times as long as the time duration of said first pulse.

7. A circuit for turning an electronic valve on and off as defined in claim 6 but further characterized by having said electronic valve comprising a silicon control rectifier.

8. A circuit for turning an electronic valve on and off as defined in claim 5 but further characterized by having said electronic valve comprising a silicon control rectifier.

9. A circuit for turning an electronic valve on and off comprising:

a first electronic valve having an input electrode, an output electrode, and a control electrode;

a first field effect transistor having an input electrode, an output electrode, and a control electrode, said output electrode and said control electrode of said first field effect transistor connected to said electronic valve output electrode;

a terminal for receiving a source of power, said first field effect input electrode connected to said terminal; and a second field effect transistor having an input electrode, and output electrode, said input electrode of said second field effect transistor connected to said input electrode of said electronic valve, said output electrode of said second field effect transistor connected to said control electrode of said electronic valve.

10. A circuit for turning an electronic valve on and off as defined in claim 9 but further characterized by said second field effect transistor having a control electrode for receiving pulses whereby said pulses causes said field effect transistor to turn said electronic valve on and off.

11. A circuit for turning an electronic valve on and off as defined in claim 10 but further characterized by having said electronic valve comprising a silicon control rectifier.

12. A circuit for turning an electronic valve on and off as defined in claim 9 but further characterized by having said electronic valve comprising a silicon control rectifier.

13. A semiconductor network adapted for operation as a high voltage multiple position molecular switch comprising:

a first field effect transistor having an input and an output electrode;

a silicon control rectifier having an input, an output and a control electrode, said silicon control rectifier output being connected to said first fieldistor input;

a resistor, said resistor having a terminal connected to said silicon control rectifier output;

a second field effect transistor having an input and an output, said second field effect transistor input being connected to said silicon control rectifier input and said field effect transistor output being connected to said control electrode of said silicon control rectifier.

14. A semiconductor network as defined in claim 13 but further characterized by having said first and said second field effect transistor, said resistor and said silicon control rectifier all made out of a single silicon wafer.

References Cited

UNITED STATES PATENTS

| | | | |
|---|---|---|---|
| 3,035,186 | 5/1962 | Doucette | 307—88.5 |
| 3,197,710 | 7/1965 | Hung Chang Lin | 330—38 |
| 3,257,631 | 6/1966 | Evans | 333—70 |
| 3,260,902 | 7/1966 | Porter | 317—235 |
| 3,302,041 | 1/1967 | Poston | 307—88.5 |

JOHN W. HUCKERT, *Primary Examiner.*

R. F. SANDLER, *Assistant Examiner.*